(12) United States Patent
Wang

(10) Patent No.: US 11,100,841 B2
(45) Date of Patent: Aug. 24, 2021

(54) SHIFT REGISTER, DRIVING METHOD THEREOF, GATE DRIVING CIRCUIT, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventor: Hongjun Wang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 675 days.

(21) Appl. No.: 16/066,729

(22) PCT Filed: Oct. 10, 2017

(86) PCT No.: PCT/CN2017/105505
§ 371 (c)(1),
(2) Date: Jun. 28, 2018

(87) PCT Pub. No.: WO2018/126754
PCT Pub. Date: Jul. 12, 2018

(65) Prior Publication Data
US 2021/0201748 A1    Jul. 1, 2021

(30) Foreign Application Priority Data
Jan. 5, 2017 (CN) ........................ 201710008480.X

(51) Int. Cl.
*G09G 3/20* (2006.01)

(52) U.S. Cl.
CPC ... *G09G 3/2092* (2013.01); *G09G 2310/0267* (2013.01); *G09G 2310/0286* (2013.01); *G09G 2310/08* (2013.01)

(58) Field of Classification Search
CPC ......... G09G 3/2092; G09G 2310/0286; G09G 2310/08
See application file for complete search history.

(56) References Cited

U.S. PATENT DOCUMENTS

| 9,953,611 | B2* | 4/2018 | Wang | ...................... G11C 19/28 |
| 9,965,985 | B2* | 5/2018 | Wang | ....................... G09G 3/20 |
| 2010/0134399 | A1 | 6/2010 | Ki et al. | |
| 2012/0256817 | A1 | 10/2012 | Chen et al. | |

(Continued)

FOREIGN PATENT DOCUMENTS

| CN | 102651186 A | 8/2012 |
| CN | 102779478 A | 11/2012 |

(Continued)

OTHER PUBLICATIONS

Search Report and Written Opinion for International Application No. PCT/CN2017/105505 dated Dec. 29, 2017.

(Continued)

*Primary Examiner* — Gene W Lee
(74) *Attorney, Agent, or Firm* — Calfee, Halter & Griswold LLP

(57) ABSTRACT

A shift register, a driving method thereof, a gate driving circuit, and a display device. The shift register includes an input sub-circuit, a reset sub-circuit, a node control sub-circuit, a potential maintenance sub-circuit, a first output sub-circuit, and a second output sub-circuit.

20 Claims, 10 Drawing Sheets

(56) References Cited

U.S. PATENT DOCUMENTS

| | | | |
|---|---|---|---|
| 2014/0064439 A1 | 3/2014 | Qing et al. | |
| 2014/0093027 A1 | 4/2014 | Jang | |
| 2014/0093028 A1 | 4/2014 | Wu | |
| 2014/0098013 A1* | 4/2014 | Chen | G09G 3/3677 345/92 |
| 2015/0179277 A1 | 6/2015 | Pai et al. | |
| 2015/0302936 A1* | 10/2015 | Ma | G11C 19/28 377/64 |
| 2015/0348596 A1 | 12/2015 | Yao et al. | |
| 2017/0193887 A1 | 7/2017 | Wang et al. | |
| 2017/0229084 A1 | 8/2017 | Wang et al. | |

FOREIGN PATENT DOCUMENTS

| | | |
|---|---|---|
| CN | 102819998 A | 12/2012 |
| CN | 103714859 A | 4/2014 |
| CN | 103761992 A | 4/2014 |
| CN | 103971628 A | 8/2014 |
| CN | 104021750 A | 9/2014 |
| CN | 105096793 A | 11/2015 |
| CN | 105096904 A | 11/2015 |
| CN | 105185341 A | 12/2015 |
| CN | 105280153 A | 1/2016 |
| CN | 105609137 A | 5/2016 |
| CN | 106504692 A | 3/2017 |

OTHER PUBLICATIONS

First Office Action for Chinese Patent Application No. 201710008480.X dated Jan. 19, 2018.

Second Office Action for Chinese Patent Application No. 201710008480.X dated Jun. 12, 2018.

\* cited by examiner

S501
In the first phase, the input sub-circuit provides the signal of the input signal terminal to the first node under the control of the signal of the input signal terminal, the first output sub-circuit provides the signal of the clock signal terminal to the driving signal output terminal under the control of the signal of the first node, and the node control sub-circuit provides the signal of the reference signal terminal to the second node under the control of the signal of the input signal terminal S502
In the second phase, the first output sub-circuit maintains a stable voltage difference between the first node and the driving signal output terminal in response to the first node being in a floating state, and provides the signal of the clock signal terminal to the driving signal output terminal under the control of the signal of the first node; the node control sub-circuit provides the signal of the reference signal terminal to the second node under the control of the signal of the driving signal output terminal S503
In the third phase, the first output sub-circuit maintains a stable voltage difference between the first node and the driving signal output terminal in response to the first node being in a floating state, and provides the signal of the clock signal terminal to the driving signal output terminal under the control of the signal of the first node; the potential maintenance sub-circuit maintains a stable voltage difference between the clock signal terminal and the second node in response to the second node being in a floating state S504
In the fourth phase, the reset sub-circuit provides the signal of the reference signal terminal to the first node under the control of the signal of the reset signal terminal, the node control sub-circuit provides the signal of the reset signal terminal to the second node under the control of the signal of the reset signal terminal; and the second output sub-circuit provides the signal of the reference signal terminal to the driving signal output terminal under the control of the signal of the second node S505
In the fifth phase, the potential maintenance sub-circuit maintains a stable voltage difference between the clock signal terminal and the second node in response to the second node being in a floating state; and the second output sub-circuit provides the signal of the reference signal terminal to the driving signal output terminal under the control of the signal of the second node

Fig.5

SHIFT REGISTER, DRIVING METHOD THEREOF, GATE DRIVING CIRCUIT, AND DISPLAY DEVICE

RELATED APPLICATION

The present application is the U.S. national phase entry of PCT/CN2017/105505, with an international filing date of Oct. 10, 2017, which claims the benefit of Chinese Patent Application No. 201710008480.X, filed on Jan. 5, 2017, the entire disclosure of which is incorporated herein by reference.

FIELD

The present disclosure relates to the field of display technologies, and particularly to a shift register, a driving method thereof, a gate driving circuit, and a display device.

BACKGROUND

With the rapid development of display technologies, display panels are increasingly oriented towards high integration level and low cost. Gate Driver on Array (GOA) technology integrates a thin film transistor (TFT) control terminal switch circuit on an array substrate of a display panel to realize scan driving of the display panel, so that bonding area of the control terminal integrated circuit (IC) and wiring space of fan-out area can be omitted. Therefore, the GOA technology can not only reduce the cost of a product in terms of material cost and preparation process, but also enable the display panel to realize a artistic design of symmetrical sides and narrow frames. In addition, this integration process may also omit a bonding process in the direction of control terminal scan lines, thereby enhancing the throughput and yield.

SUMMARY

Embodiments of the present disclosure provide a shift register, a driving method thereof, a gate driving circuit, and a display device, which can at least partially alleviate or even eliminate the above-mentioned problems in the prior art.

Accordingly, embodiments of the present disclosure provide a shift register comprising an input sub-circuit, a reset sub-circuit, a potential maintenance sub-circuit, a node control sub-circuit, a first output sub-circuit, and a second output sub-circuit. The input sub-circuit is connected to an input signal terminal and a first node, respectively, and configured to provide a signal of the input signal terminal to the first node under the control of the signal of the input signal terminal. The reset sub-circuit is connected to a reset signal terminal, a reference signal terminal, and the first node, respectively, and configured to provide a signal of the reference signal terminal to the first node under the control of a signal of the reset signal terminal. The potential maintenance sub-circuit is connected to a clock signal terminal and a second node, respectively, and configured to maintain a stable voltage difference between the clock signal terminal and the second node in response to the second node being in a floating state. The node control sub-circuit is connected to the input signal terminal, the reset signal terminal, the reference signal terminal, the second node, and a driving signal output terminal of the shift register, respectively, and configured to provide the signal of the reference signal terminal to the second node under the control of the signal of the input signal terminal, provide the signal of the reset signal terminal to the second node under the control of the signal of the reset signal terminal, and provide the signal of the reference signal terminal to the second node under the control of a signal of the driving signal output terminal. The first output sub-circuit is connected to the clock signal terminal, the first node, and the driving signal output terminal, respectively, and configured to provide the signal of the clock signal terminal to the driving signal output terminal under the control of the signal of the first node, and maintain a stable voltage difference between the first node and the driving signal output terminal in response to the first node being in a floating state. The second output sub-circuit is connected to the reference signal terminal, the second node, and the driving signal output terminal, respectively, and configured to provide the signal of the reference signal terminal to the driving signal output terminal under the control of a signal of the second node.

In some embodiments of the present disclosure, the potential maintenance sub-circuit comprises a first capacitor. One end of the first capacitor is connected to the clock signal terminal, and the other end of the first capacitor is connected to the second node.

In some embodiments of the present disclosure, the input sub-circuit comprises a first transistor. A control terminal and a first terminal of the first transistor are both connected to the input signal terminal, and a second terminal of the first transistor is connected to the first node.

In some embodiments of the present disclosure, the reset sub-circuit comprises a second transistor. A control terminal of the second transistor is connected to the reset signal terminal, a first terminal of the second transistor is connected to the reference signal terminal, and a second terminal of the second transistor is connected to the first node.

In some embodiments of the present disclosure, the node control sub-circuit comprises a third transistor, a fourth transistor, and a fifth transistor. A control terminal of the third transistor is connected to the input signal terminal, a first terminal of the third transistor is connected to the reference signal terminal, and a second terminal of the third transistor is connected to the second node. A control terminal and a first terminal of the fourth transistor are both connected to the reset signal terminal, and a second terminal of the fourth transistor is connected to the second node. A control terminal of the fifth transistor is connected to the driving signal output terminal, a first terminal of the fifth transistor is connected to the reference signal terminal, and a second terminal of the fifth transistor is connected to the second node.

In some embodiments of the present disclosure, the first output sub-circuit comprises a sixth transistor and a second capacitor. A control terminal of the sixth transistor is connected to the first node, a first terminal of the sixth transistor is connected to the clock signal terminal, and a second terminal of the sixth transistor is connected to the driving signal output terminal. One end of the second capacitor is connected to the first node, and the other end of the second capacitor is connected to the driving signal output terminal.

In some embodiments of the present disclosure, the second output sub-circuit comprises a seventh transistor. A control terminal of the seventh transistor is connected to the second node, a first terminal of the seventh transistor is connected to the reference signal terminal, and a second terminal of the seventh transistor is connected to the driving signal output terminal.

In some embodiments of the present disclosure, the above shift register further comprises a first node stabilization sub-circuit. The first node stabilization sub-circuit is connected to the reference signal terminal, the first node, and the second node, respectively, and configured to provide the signal of the reference signal terminal to the first node under the control of the signal of the second node.

In some embodiments of the present disclosure, the first node stabilization sub-circuit comprises an eighth transistor. A control terminal of the eighth transistor is connected to the second node, a first terminal of the eighth transistor is connected to the reference signal terminal, and a second terminal of the eighth transistor is connected to the first node.

In some embodiments of the present disclosure, the above shift register further comprises a second node stabilization sub-circuit. The second node stabilization sub-circuit is connected to a node stabilization control signal terminal and the second node, respectively, and configured to provide a signal of the node stabilization control signal terminal to the second node under the control of the signal of the node stabilization control signal terminal.

In some embodiments of the present disclosure, the second node stabilization sub-circuit comprises a ninth transistor. A control terminal and a first terminal of the ninth transistor are both connected to the node stabilization control signal terminal, and a second terminal of the ninth transistor is connected to the second node.

Accordingly, embodiments of the present disclosure further provide a gate driving circuit comprising cascaded M shift registers provided by embodiments of the present disclosure, where M is an integer greater than or equal to 3. Specifically, an input signal terminal of a first stage shift register is connected to a first frame trigger signal terminal; an input signal terminal of a second stage shift register is connected to a second frame trigger signal terminal; an input signal terminal of an N-th stage shift register is connected to a driving signal output terminal of an (N−2)-th stage shift register; and a reset signal terminal of the (N−2)-th stage shift register is connected to a driving signal output terminal of the N-th stage shift register, N being an integer greater than or equal to 3 and less than or equal to M.

Accordingly, embodiments of the present disclosure further provide a display device comprising the gate driving circuit provided above by embodiments of the present disclosure.

Accordingly, embodiments of the present disclosure further provide a driving method of any of the shift register provided by embodiments of the present disclosure, comprising a first phase, a second phase, a third phase, a fourth phase, and a fifth phase.

In the first phase, the input sub-circuit provides the signal of the input signal terminal to the first node under the control of the signal of the input signal terminal; the first output sub-circuit provides the signal of the clock signal terminal to the driving signal output terminal under the control of the signal of the first node; and the node control sub-circuit provides the signal of the reference signal terminal to the second node under the control of the signal of the input signal terminal.

In the second phase, the first output sub-circuit maintains a stable voltage difference between the first node and the driving signal output terminal in response to the first node being in a floating state, and provides the signal of the clock signal terminal to the driving signal output terminal under the control of the signal of the first node; the node control sub-circuit provides the signal of the reference signal terminal to the second node under the control of the signal of the driving signal output terminal.

In the third phase, the first output sub-circuit maintains a stable voltage difference between the first node and the driving signal output terminal in response to the first node being in a floating state, and provides the signal of the clock signal terminal to the driving signal output terminal under the control of the signal of the first node; the potential maintenance sub-circuit maintains a stable voltage difference between the clock signal terminal and the second node in response to the second node being in a floating state.

In the fourth phase, the reset sub-circuit provides the signal of the reference signal terminal to the first node under the control of the signal of the reset signal terminal; the node control sub-circuit provides the signal of the reset signal terminal to the second node under the control of the signal of the reset signal terminal; the second output sub-circuit provides the signal of the reference signal terminal to the driving signal output terminal under the control of the signal of the second node;

In the fifth phase, the potential maintenance sub-circuit maintains a stable voltage difference between the clock signal terminal and the second node in response to the second node being in a floating state; the second output sub-circuit provides the signal of the reference signal terminal to the driving signal output terminal under the control of the signal of the second node.

In some embodiments of the present disclosure, each shift register further comprises the first node stabilization sub-circuit, and the driving method further comprises: in the fourth phase, providing, by the first node stabilization sub-circuit, the signal of the reference signal terminal to the first node under the control of the signal of the second node; and in the fifth phase, providing, by the first node stabilization sub-circuit, the signal of the reference signal terminal to the first node under the control of the signal of the second node.

In some embodiments of the present disclosure, each shift register further comprises the second node stabilization sub-circuit, and the driving method further comprises: in the fourth phase, providing, by the second node stabilization sub-circuit, the signal of the node stabilization control signal terminal to the second node under the control of the signal of the node stabilization control signal terminal.

BRIEF DESCRIPTION OF DRAWINGS

FIG. 2a is a schematic diagram illustrating a structure of the shift register shown in FIG. 1a;

FIG. 2b is a schematic diagram illustrating another structure of the shift register shown in FIG. 1a;

FIG. 4a is an input and output timing diagram of the shift register shown in FIG. 3a;

FIG. 5 is a flowchart of a driving method provided by embodiments of the present disclosure.

DETAILED DESCRIPTION

Specific implementations of a shift register, a driving method thereof, a gate driving circuit, and a display device provided by embodiments of the present disclosure will be described in detail below with reference to the accompanying drawings. It should be understood that the exemplary embodiments described herein are only used to illustrate and explain the present disclosure and are not used to limit the present disclosure. In the case of causing no conflict, the embodiments in the present application and the features in the embodiments can be combined with each other.

A typical gate driving circuit consists of a plurality of cascaded shift registers. Scan signals are inputted successively to individual gate lines on the display panel via the shift registers of respective stages. Currently, after the shift register of each stage outputs a valid pulse signal of the scan signal, when a driving signal output terminal of the shift register is in a low potential maintenance phase, a pull-down transistor provides a low potential reference signal to the driving signal output terminal under control of a signal of a pull-down node, so that the driving signal output terminal is in a low potential output state. However, in the low potential maintenance phase, the potential of the control terminal of the pull-down transistor may leak, that is, the potential of the signal of the pull-down node may change, so that the pull-down transistor cannot be fully turned on and may even be turned off, thereby causing the driving signal output terminal to be unable to maintain a low potential. This situation may decrease the stability of the shift register, and may further lead to display abnormalities.

Figure 1A:
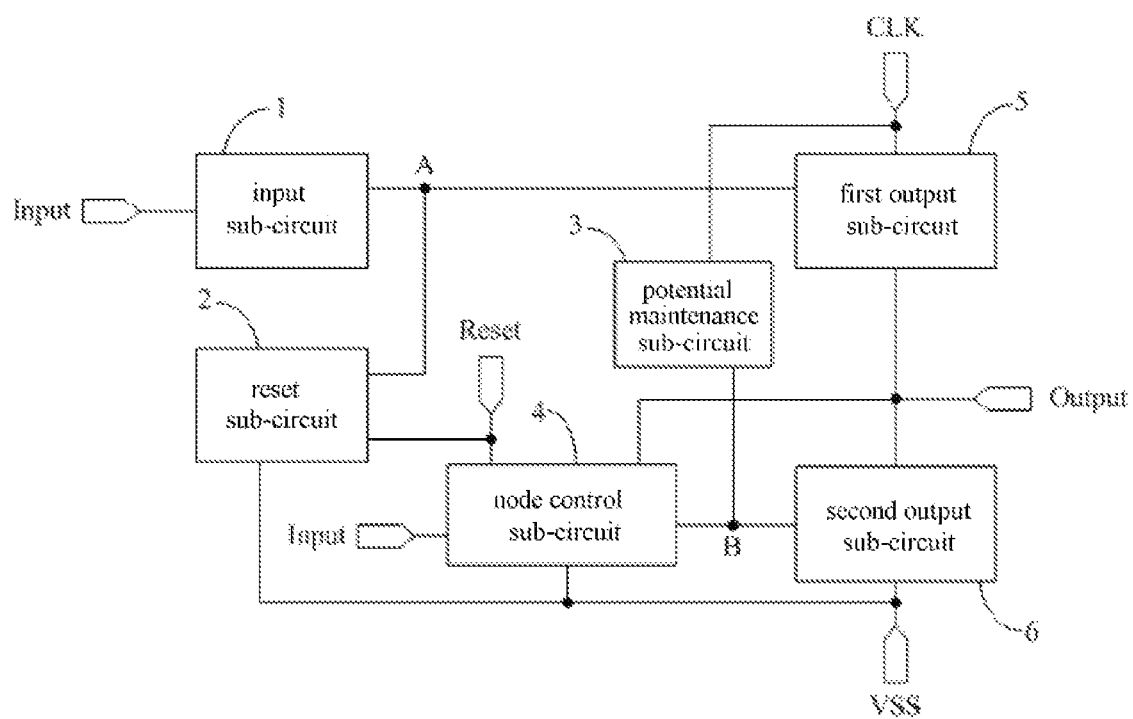
FIG. 1a is a schematic structural diagram of a shift register provided by an embodiment of the present disclosure.
Figure 1B:
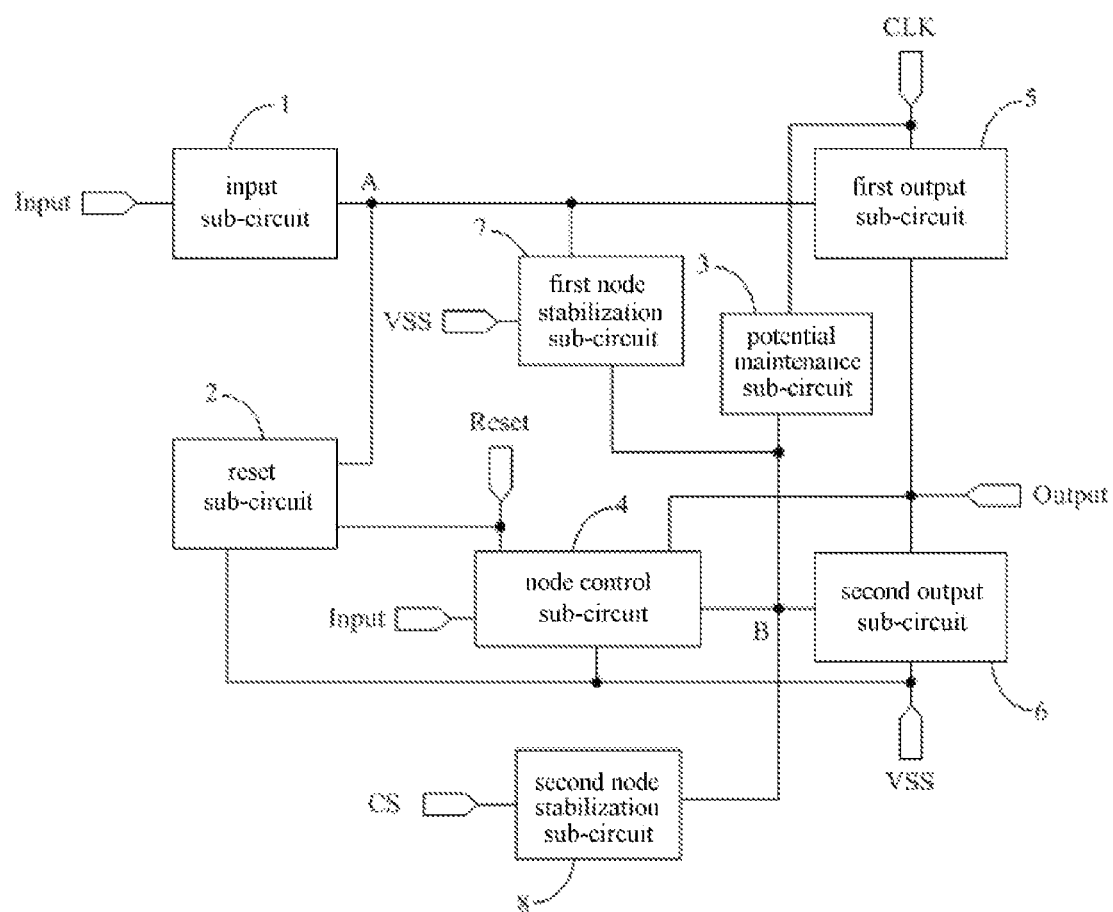
FIG. 1b is a schematic structural diagram of a shift register provided by another embodiment of the present disclosure.

Embodiments of the present disclosure provide a shift register, as shown in FIGS. 1a and 1b, comprising an input sub-circuit 1, a reset sub-circuit 2, a potential maintenance sub-circuit 3, a node control sub-circuit 4, a first output sub-circuit 5, and a second output sub-circuit. 6. The input sub-circuit 1 is connected to an input signal terminal Input and a first node A, respectively, and configured to provide a signal of the input signal terminal Input to the first node A under the control of the signal of the input signal terminal Input. The reset sub-circuit 2 is connected to a reset signal terminal Reset, a reference signal terminal VSS and the first node A, respectively, and configured to provide a signal of the reference signal terminal VSS to the first node A under the control of a signal of the reset signal terminal Reset. The potential maintenance sub-circuit 3 is connected to a clock signal terminal CLK and a second node B, respectively, and configured to maintain a stable voltage difference between the clock signal terminal CLK and the second node B in response to the second node B being in a floating state. The node control sub-circuit 4 is connected to the input signal terminal Input, the reset signal terminal Reset, the reference signal terminal VSS, the second node B, and a driving signal output terminal Output of the shift register, respectively, and configured to provide the signal of the reference signal terminal VSS to the second node B under the control of the signal of the input signal terminal Input, provide the signal of the reset signal terminal Reset to the second node B under the control of the signal of the reset signal terminal Reset, and provide the signal of the reference signal terminal VSS to the second node B under the control of the signal of the driving signal output terminal Output. The first output sub-circuit 5 is connected to the clock signal terminal CLK, the first node A, and the driving signal output terminal Output, respectively, and configured to provide a signal of the clock signal terminal CLK to the driving signal output terminal Output under the control of a signal of the first node A, and maintain a stable voltage difference between the first node A and the driving signal output terminal Output in response to the first node A being in a floating state. The second output sub-circuit 6 is connected to the reference signal terminal VSS, the second node B, and the driving signal output terminal Output, respectively, and configured to provide the signal of the reference signal terminal VSS to the driving signal output terminal Output under the control of the signal of the second node B.

The shift register provided by embodiments of the present disclosure comprises: an input sub-circuit, a reset sub-circuit, a node control sub-circuit, a potential maintenance sub-circuit, a first output sub-circuit, and a second output sub-circuit, wherein the input sub-circuit is configured to provide the signal of the input signal terminal to the first node under the control of the signal of the input signal terminal; the reset sub-circuit is configured to provide the signal of the reference signal terminal to the first node under the control of the signal of the reset signal terminal; the potential maintenance sub-circuit is configured to maintain a stable voltage difference between the clock signal terminal and the second node in response to the second node being in a floating state; the node control sub-circuit is configured to provide the signal of the reference signal terminal to the second node under the control of the signal of the input signal terminal, provide the signal of the reset signal terminal to the second node under the control of the signal of the reset signal terminal, and provide the signal of the reference signal terminal to the second node under the control of the signal of the driving signal output terminal; the first output sub-circuit is configured to provide the signal of the clock signal terminal to the driving signal output terminal under the control of the signal of the first node, and maintain a stable voltage difference between the first node and the driving signal output terminal in response to the first node being in a floating state; and the second output sub-circuit is configured to provide the signal of the reference signal terminal to the driving signal output terminal under the control of the signal of the second node. Therefore, the above shift register provided by embodiments of the present disclosure enables the potential maintenance sub-circuit to maintain the potential of the second node by means of cooperation of the above six sub-circuits so as to ensure normal output of the second output sub-circuit, thereby improving the output stability of the shift register to make the output of the driving signal output terminal more stable.

It is to be noted that in the above shift register provided by embodiments of the present disclosure, when a valid pulse signal of the input signal terminal is at a high potential, the reference signal terminal is at a low potential. Alternatively, when the valid pulse signal of the input signal terminal is at a low potential, the reference signal terminal is at a high potential.

Further, in order to make the potential of the first node in a stable state, the above shift register provided by embodiments of the present disclosure, as shown in FIG. 1b, may further comprise a first node stabilization sub-circuit 7. The first node stabilization sub-circuit 7 is connected to the reference signal terminal VSS, the first node A, and the second node B, respectively, and configured to provide the signal of the reference signal terminal VSS to the first node A under the control of the signal of the second node B.

Further, in order to make the potential of the second node in a stable state, the above shift register provided by embodiments of the present disclosure, as shown in FIG. 1b, may further comprise a second node stabilization sub-circuit 8. The second node stabilization sub-circuit 8 is connected to a node stabilization control signal terminal CS and the second node B, respectively, and configured to provide a signal of the node stabilization control signal terminal CS to the second node B under the control of the signal of the node stabilization control signal terminal CS.

In certain exemplary embodiments, in order to make the potential of the first node A and the potential of the second node B in a stable state, the above shift register provided by embodiments of the present disclosure, as shown in FIG. 1b, may comprise both the first node stabilization sub-circuit 7 and the second node stabilization sub-circuits 8. The first node stabilization sub-circuit 7 is connected to the reference signal terminal VSS, the first node A, and the second node B, respectively, and configured to provide the signal of the reference signal terminal VSS to the first node A under the control of the signal of the second node B. The second node stabilization sub-circuit 8 is connected to the node stabilization control signal terminal CS and the second node B, respectively, and configured to provide the signal of the node stabilization control signal terminal CS to the second node B under the control of the signal of the node stabilization control signal terminal CS.

Further, in order to reduce the number of signal lines, in the above shift register provided by embodiments of the present disclosure, the node stabilization control signal terminal may be the same signal terminal as the reset signal terminal.

The present disclosure will be described in detail below in conjunction with specific embodiments. It is to be noted that these specific embodiments are provided to better explain the present disclosure, rather than limit the scope of the present disclosure.

In the above shift register provided by embodiments of the present disclosure, as shown in FIGS. 2a to 3b, the input sub-circuit 1 may specifically comprise a first transistor M1. A control terminal and a first terminal of the first transistor M1 are both connected to the input signal terminal Input, and a second terminal of the first transistor M1 is connected to the first node A.

Figure 2A:
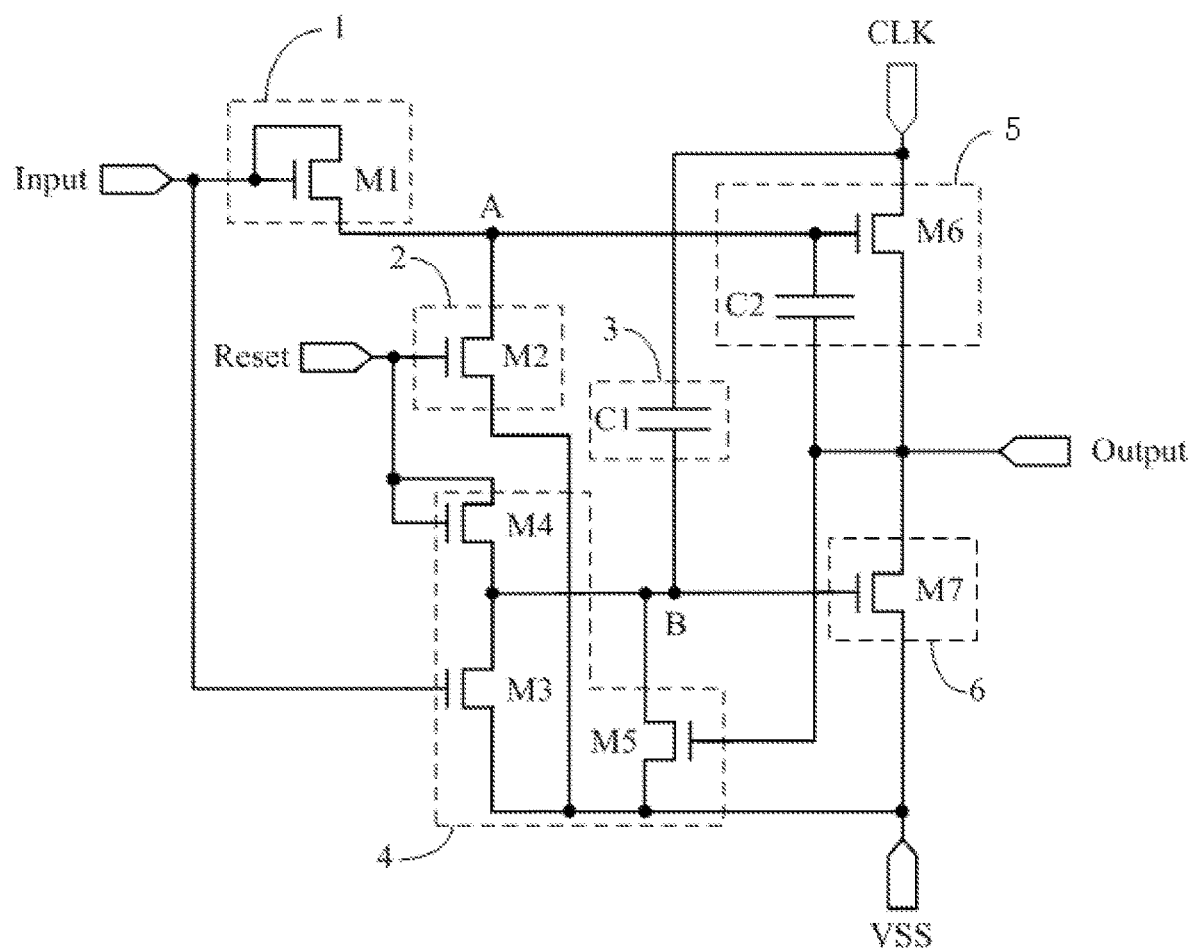
Figure 2B:
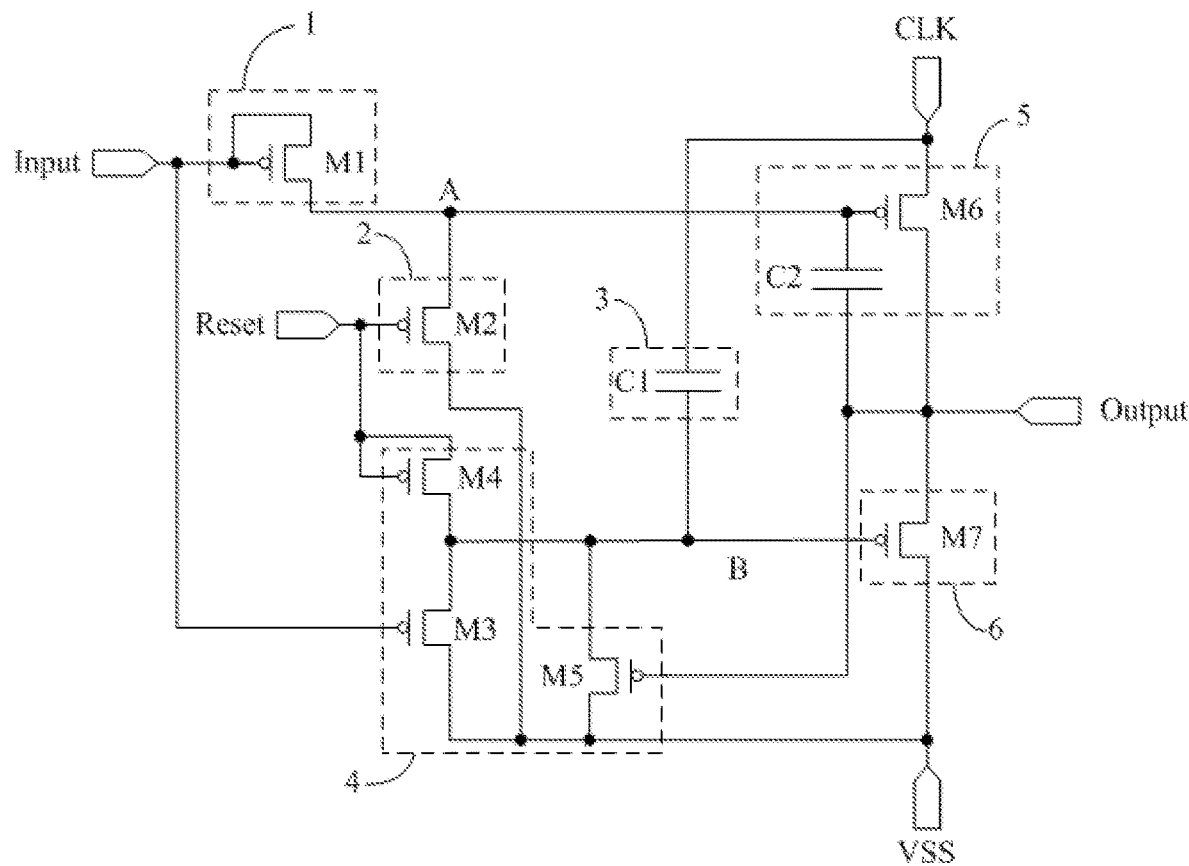
Figure 3A:
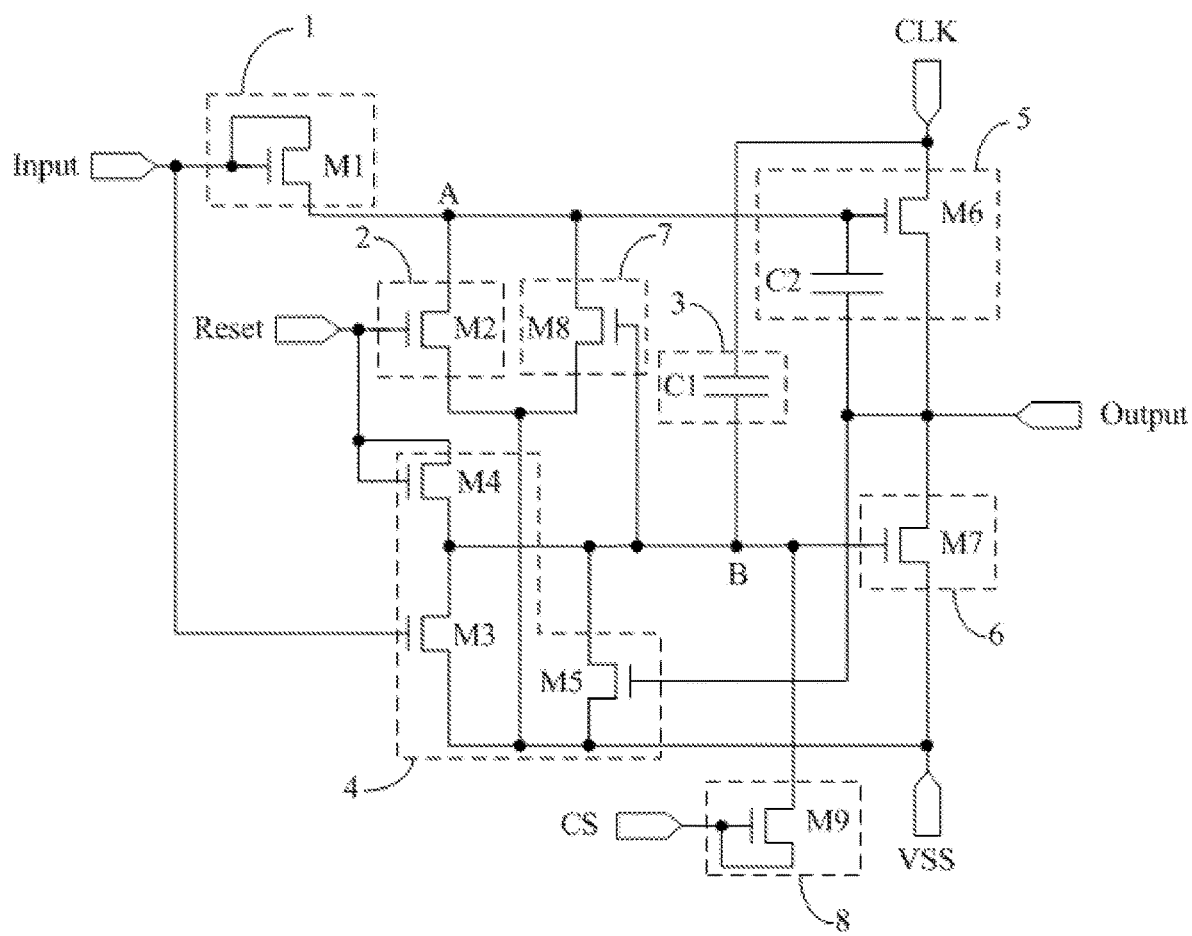
FIG. 3a is a schematic diagram illustrating a structure of the shift register shown in FIG. 1b.
Figure 3B:
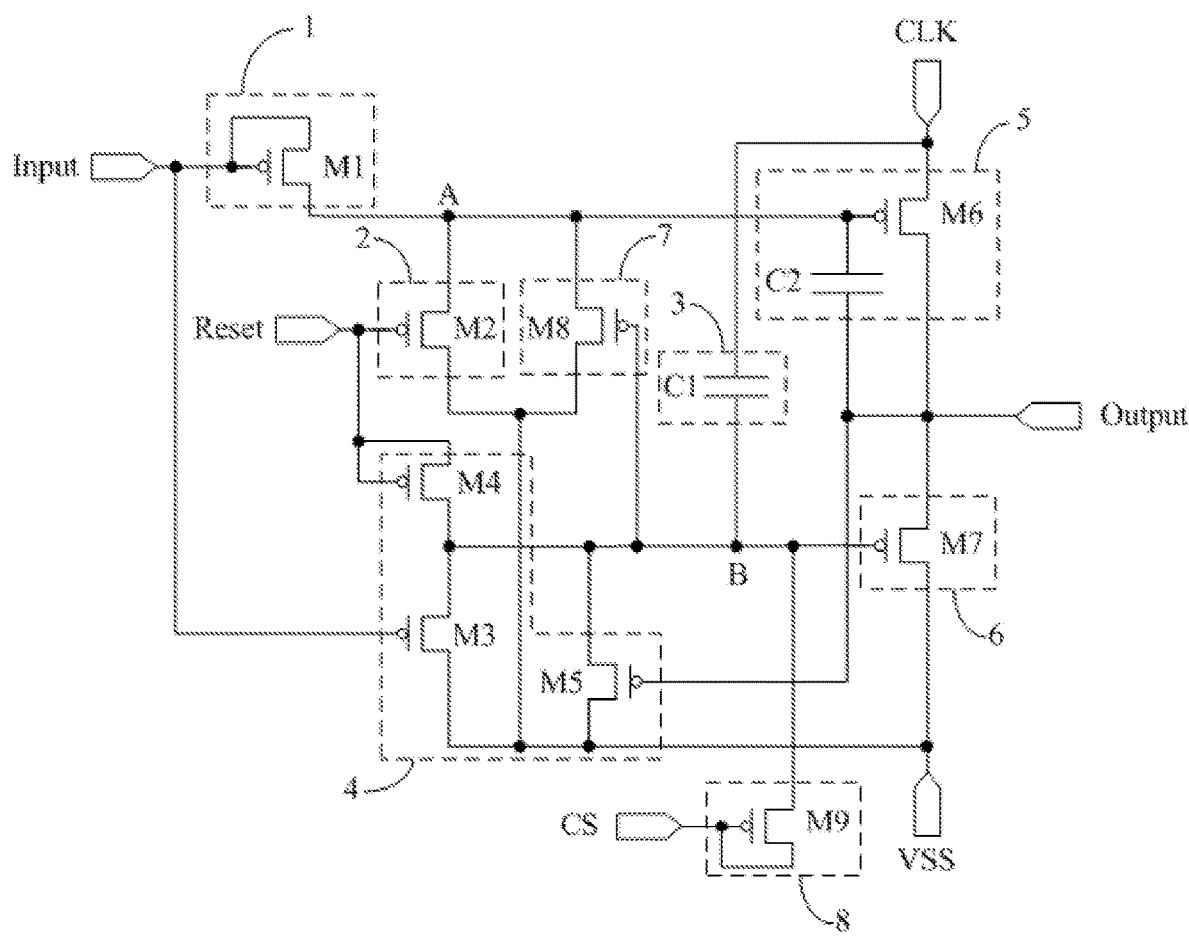
FIG. 3b is a schematic diagram illustrating another structure of the shift register shown in FIG. 1b.

In the above shift register provided by embodiments of the present disclosure, when the valid pulse signal of the input signal terminal Input is at a high potential, as shown in FIGS. 2a and 3a, the first transistor M1 may be an N-type transistor. Alternatively, when the valid pulse signal of the input signal terminal Input is at a low potential, as shown in FIGS. 2b and 3b, the first transistor M1 may be a P-type transistor, which is not limited herein.

In the above shift register provided by embodiments of the present disclosure, the first transistor provides the signal of the input signal terminal to the first node when the first transistor is in a turn-on state under the control of the signal of the input signal terminal.

The above merely illustrates, by way of example, a specific structure of the input sub-circuit in the shift register. Upon implementation, the specific structure of the input sub-circuit is not limited to the above structure provided by embodiments of the present disclosure, but may also be other structures known to those skilled in the art, which is not limited herein.

In the above shift register provided by embodiments of the present disclosure, as shown in FIGS. 2a to 3b, the reset sub-circuit 2 may specifically comprise a second transistor M2. A control terminal of the second transistor M2 is connected to the reset signal terminal Reset, a first terminal of the second transistor M2 is connected to the reference signal terminal VSS, and a second terminal of the second transistor M2 is connected to the first node A.

In the above shift register provided by embodiments of the present disclosure, when a valid pulse signal of the reset signal terminal Reset is at a high potential, as shown in FIGS. 2a and 3a, the second transistor M2 may be an N-type transistor. Alternatively, when the valid pulse signal of the reset signal terminal Reset is at a low potential, as shown in FIGS. 2b and 3b, the second transistor M2 may be a P-type transistor, which is not limited herein.

In the above shift register provided in the embodiment of the present disclosure, the second transistor provides the signal of the reference signal terminal to the first node when the second transistor is in a turn-on state under the control of the signal of the reset signal terminal.

The above merely illustrates, by way of example, a specific structure of the reset sub-circuit in the shift register. Upon implementation, the specific structure of the reset sub-circuit is not limited to the above structure provided by embodiments of the present disclosure, but may also be other structures known to those skilled in the art, which is not limited herein.

In the above shift register provided by embodiments of the present disclosure, as shown in FIGS. 2a to 3b, the potential maintenance sub-circuit 3 may specifically comprise a first capacitor C1. One end of the first capacitor C1 is connected to the clock signal terminal CLK, and the other end of the first capacitor C1 is connected to the second node B.

In the shift register provided in the embodiment of the present disclosure, when the second node is in a floating state, the voltage difference across the first capacitor can be kept stable due to its bootstrap function, i.e. a stable voltage difference is maintained between the second node and the clock signal terminal.

The above merely illustrates, by way of example, a specific structure of the potential maintenance sub-circuit in the shift register. Upon implementation, the specific structure of the potential maintenance sub-circuit is not limited to the above structure provided by embodiments of the present disclosure, but may also be other structures known to those skilled in the art, which is not limited herein.

In the above shift register provided by embodiments of the present disclosure, as shown in FIGS. 2a to 3b, the node control sub-circuit 4 may specifically comprise a third transistor M3, a fourth transistor M4, and a fifth transistor M5. A control terminal of the third transistor M3 is connected to the input signal terminal Input, a first terminal of the third transistor M3 is connected to the reference signal terminal VSS, and a second terminal of the third transistor M3 is connected to the second node B. A control terminal and a first terminal of the fourth transistor M4 are both connected to the reset signal terminal Reset, and a second terminal of the fourth transistor M4 is connected to the second node B. A control terminal of the fifth transistor M5 is connected to the driving signal output terminal Output, a first terminal of the fifth transistor M5 is connected to the reference signal terminal VSS, and a second terminal of the fifth transistor M5 is connected to the second node B.

In the above shift register provided by embodiments of the present disclosure, when the valid pulse signal of the input signal terminal Input is at a high potential, as shown in FIGS. 2a and 3a, the third transistor M3 and the fifth transistor M5 may be N-type transistors. Alternatively, when the valid pulse signal of the input signal terminal Input is at a low potential, as shown in FIGS. 2b and 3b, the third transistor M3 and the fifth transistor M5 may be P-type transistors, which is not limited herein.

In the above shift register provided by embodiments of the present disclosure, when the valid pulse signal of the reset signal terminal Reset is at a high potential, as shown in FIGS. 2a and 3a, the fourth transistor M4 may be an N-type transistor. Alternatively, when the valid pulse signal of the reset signal terminal Reset is at a low potential, as shown in FIGS. 2b and 3b, the fourth transistor M4 may be a P-type transistor, which is not limited herein.

In the above shift register provided by embodiments of the present disclosure, the third transistor provides the signal of the reference signal terminal to the second node when the third transistor is in a turn-on state under the control of the signal of the input signal terminal. The fourth transistor provides the signal of the reset signal terminal to the second node when it is in a turn-on state under the control of the signal of the reset signal terminal. The fifth transistor provides the signal of the reference signal terminal to the second node when it is in a turn-on state under the control of the signal of the driving signal output terminal.

The above merely illustrates, by way of example, a specific structure of the node control sub-circuit in the shift register. Upon implementation, the specific structure of the node control sub-circuit is not limited to the above structure provided by embodiments of the present disclosure, but may also be other structures known to those skilled in the art, which is not limited herein.

In the above shift register provided by embodiments of the present disclosure, as shown in FIGS. 2a to 3b, the first output sub-circuit 5 may specifically comprise a sixth transistor M6 and a second capacitor C2. A control terminal of the sixth transistor M6 is connected to the first node A, a first terminal of the sixth transistor M6 is connected to the clock signal terminal CLK, and a second terminal of the sixth transistor M6 is connected to the driving signal output terminal Output. One end of the second capacitor C2 is connected to the first node A, and the other end of the second capacitor C2 is connected to the driving signal output terminal Output.

In the above shift register provided by embodiments of the present disclosure, when the valid pulse signal of the input signal terminal Input is at a high potential, as shown in FIGS. 2a and 3a, the sixth transistor M6 may be an N-type transistor. Alternatively, when the valid pulse signal of the input signal terminal Input is at a low potential, as shown in FIGS. 2b and 3b, the sixth transistor M6 may be a P-type transistor. No limitation is made here.

In the above shift register provided by embodiments of the present disclosure, the sixth transistor provides the signal of the clock signal terminal to the driving signal output terminal when it is in a turn-on state under the control of the signal of the first node. When the first node is in a floating state, the voltage difference across the second capacitor can be kept stable due to its bootstrap function, i.e. a stable voltage difference is maintained between the first node and the driving signal output terminal.

The above merely illustrates, by way of example, a specific structure of the first output sub-circuit in the shift register. Upon implementation, the specific structure of the first output sub-circuit is not limited to the above structure provided by embodiments of the present disclosure, but may also be other structures known to those skilled in the art, which is not limited herein.

In the above shift register provided by embodiments of the present disclosure, as shown in FIGS. 2a to 3b, the second output sub-circuit 6 may specifically comprise a seventh transistor M7. A control terminal of the seventh transistor M7 is connected to the second node B, a first terminal of the seventh transistor M7 is connected to the reference signal terminal VSS, and a second terminal of the seventh transistor M7 is connected to the driving signal output terminal Output.

In the above shift register provided by embodiments of the present disclosure, when the valid pulse signal of the input signal terminal Input is at a high potential, as shown in FIGS. 2a and 3a, the seventh transistor M7 may be an N-type transistor. Alternatively, when the valid pulse signal of the input signal terminal Input is at a low potential, as shown in FIGS. 2b and 3b, the seventh transistor M7 may be a P-type transistor. No limitation is made here.

In the above shift register provided by embodiments of the present disclosure, the seventh transistor provides the signal of the reference signal terminal to the driving signal output terminal when it is in a turn-on state under the control of the signal of the second node.

The above merely illustrates, by way of example, a specific structure of the second output sub-circuit in the shift register. Upon implementation, the specific structure of the second output sub-circuit is not limited to the above structure provided by embodiments of the present disclosure, but may also be other structures known to those skilled in the art, which are not limited herein.

In the above shift register provided by embodiments of the present disclosure, as shown in FIGS. 3a and 3b, the first node stabilization sub-circuit 7 may specifically comprise an eighth transistor M8. A control terminal of the eighth transistor M8 is connected to the second node B, a first terminal of the eighth transistor M8 is connected to the reference signal terminal VSS, and a second terminal of the eighth transistor M8 is connected to the first node A.

In the above shift register provided by embodiments of the present disclosure, when the valid pulse signal of the input signal terminal Input is at a high potential, as shown in FIG. 3a, the eighth transistor M8 may be an N-type transistor. Alternatively, when the valid pulse signal of the input signal terminal Input is at a low potential, as shown in FIG. 3b, the eighth transistor M8 may be a P-type transistor. No limitation is made here.

In the above shift register provided by embodiments of the present disclosure, the eighth transistor provides the signal of the reference signal terminal to the first node when it is in a turn-on state under the control of the signal of the second node.

The above merely illustrates, by way of example, a specific structure of the first node stabilization sub-circuit in the shift register. Upon implementation, the specific structure of the first node stabilization sub-circuit is not limited to the above structure provided by embodiments of the present disclosure, but may also be other structures known to those skilled in the art, which is not limited herein.

In the above shift register provided by embodiments of the present disclosure, as shown in FIGS. 3a and 3b, the second node stabilization sub-circuit 8 may specifically comprise a ninth transistor M9. A control terminal and a first terminal of the ninth transistor M9 are both connected to the node stabilization control signal terminal CS, and a second terminal of the ninth transistor M9 is connected to the second node B.

In the above shift register provided by embodiments of the present disclosure, when the valid pulse signal of the node stabilization control signal terminal CS is at a high potential, as shown in FIG. 3a, the ninth transistor M9 may be an N-type transistor. Alternatively, when the valid pulse signal of the node stabilization control signal terminal CS is at a low potential, as shown in FIG. 3b, the ninth transistor M9 may be a P-type transistor. No limitation is made here.

In the above shift register provided by embodiments of the present disclosure, when the ninth transistor provides the signal of the node stabilization control signal terminal to the second node when it is in a turn-on state under the control of the signal of the node stabilization control signal terminal.

The above merely illustrates, by way of example, a specific structure of the second node stabilization sub-circuit in the shift register. Upon implementation, the specific structure of the second node stabilization sub-circuit is not limited to the above structure provided by embodiments of the present disclosure, but may also be other structures known to those skilled in the art, which is not limited herein.

In certain exemplary embodiments, in order to simplify the preparation process, in the above shift register provided by embodiments of the present disclosure, when the valid pulse signal of the input signal terminal Input is at a high potential, as shown in FIGS. 2a and 3a, all the transistors may be N-type transistors. Alternatively, when the valid pulse signal of the input signal terminal Input is at a low potential, as shown in FIGS. 2b and 3b, all the transistors may be P-type transistors. No limitation is made here.

Further, in the above shift register provided by embodiments of the present disclosure, an N-type transistor is turned on under the effect of a high potential at a control terminal thereof, and is turned off under the effect of a low potential at the control terminal thereof. A P-type transistor is turned off under the effect of a high potential at a control terminal thereof, and is turned on under the effect of a low potential at the control terminal thereof.

It is to be noted that the transistors mentioned in the above embodiments of the present disclosure may be amorphous silicon thin film transistors (a-Si TFTs) or metal oxide semiconductor (MOS) field effect transistors, which are not limited herein. Upon implementation, a first terminal and a second terminal of each transistor can be interchanged according to the type of the transistor and the input signal, which are not specifically distinguished here.

An operating process of the above shift register provided by embodiments of the present disclosure will be described below in conjunction with a circuit timing diagram. In the description below, a high potential signal is denoted as 1, and a low potential signal is denoted as 0, wherein 1 and 0 represent logic potentials and are only for better explaining the operating process of the above shift register provided by embodiments of the present disclosure, which are not actual potentials applied to a control terminal of each transistor.

Figure 4A:
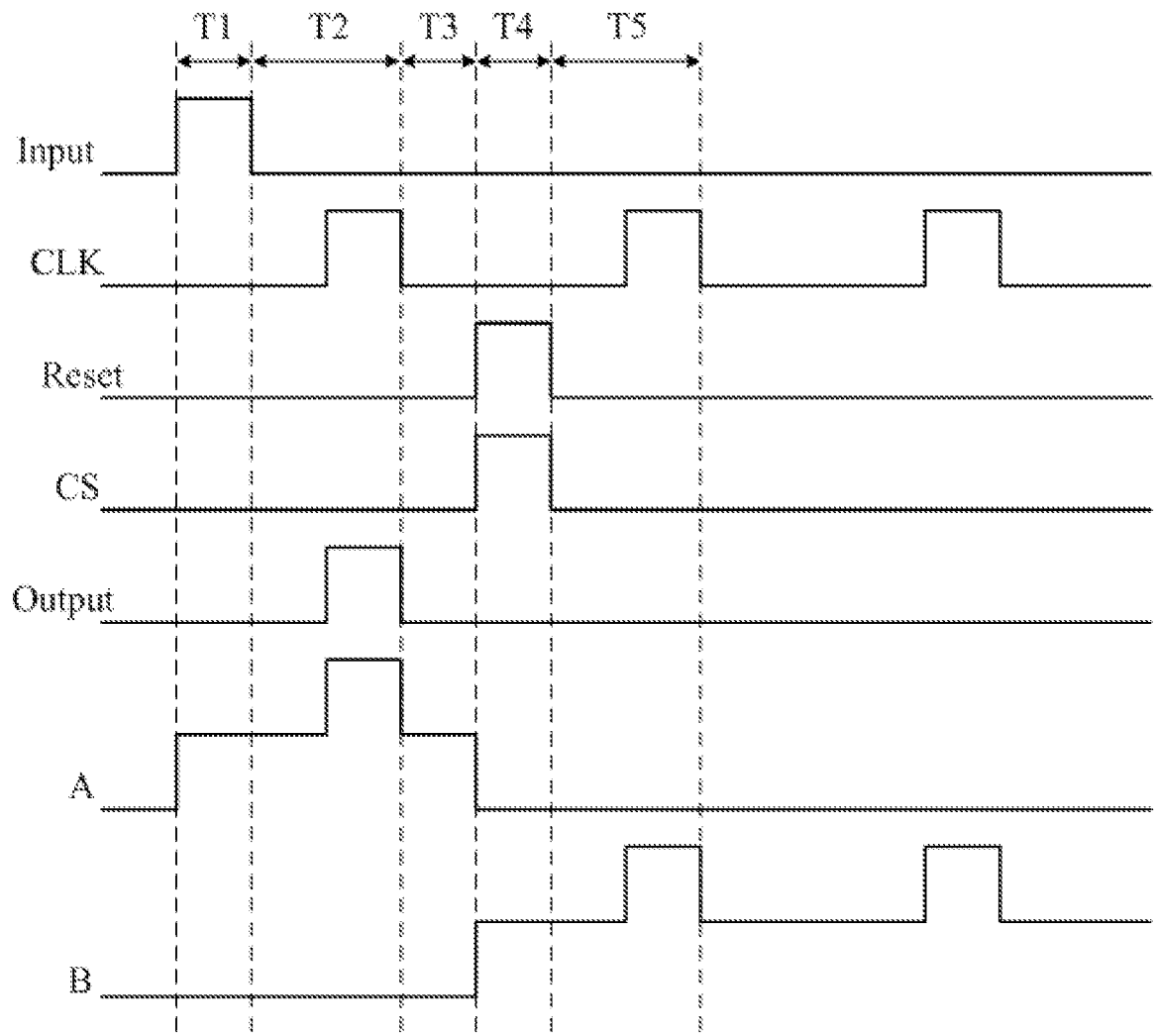

An operating process of the shift register will be described by taking the structure of the shift register shown in FIG. 3a as an example. In the shift register shown in FIG. 3a, all the transistors are N-type transistors, and each of the N-type transistors is turned on under the effect of a high potential at the control terminal thereof and turned off under the effect of a low potential at the control terminal thereof. A corresponding input and output timing diagram is shown in FIG. 4a.

In a first phase T1, Input=1, Reset=0, CLK=0, CS=0.

Since Input=1, both the first transistor M1 and the third transistor M3 are turned on. Since the first transistor M1 is turned on to provide the signal of the input signal terminal Input at a high potential to the first node A, the first node A is at a high potential. Since the first node A is at a high potential, the sixth transistor M6 is turned on. Since the sixth transistor M6 is turned on to provide the signal of the clock signal terminal CLK at a low potential to the driving signal output terminal Output, the second capacitor C2 is charged, and the driving signal output terminal Output is at a low potential, i.e. outputting a low-potential scan signal. Since the third transistor M3 is turned on to provide the signal of the reference signal terminal VSS at a low potential to the second node B, the second node B is at a low potential. Since the second node B is at a low potential, both the seventh transistor M7 and the eighth transistor M8 are turned off. Since the driving signal output terminal Output is at a low potential, the fifth transistor M5 is turned off. Since CS=0, the ninth transistor M9 is turned off. Since Reset=0, both the second transistor M2 and the fourth transistor M4 are turned off.

In a second phase T2, in the first half phase, Input=0, Reset=0, CLK=0, CS=0.

Since Input=0, both the first transistor M1 and the third transistor M3 are turned off. Since CS=0, the ninth transistor M9 is turned off. Since Reset=0, both the second transistor M2 and the fourth transistor M4 are turned off so that the first node A is in a floating state. When the first node A is in the floating state, the first node A is maintained at a high potential, so that the sixth transistor M6 is turned on. Since the sixth transistor M6 is turned on to provide the signal of the clock signal terminal CLK at a low potential to the driving signal output terminal Output, the driving signal output terminal Output is at a low potential, i.e. outputting a low-potential scan signal.

In the second phase T2, in the second half phase, Input=0, Reset=0, CLK=1, and CS=0.

Since Input=0, both the first transistor M1 and the third transistor M3 are turned off. Since CS=0, the ninth transistor M9 is turned off. Since Reset=0, both the second transistor M2 and the fourth transistor M4 are turned off, and the first node A is in a floating state. Since the first node A is in the floating state, the first node A is maintained at a high potential, so that the sixth transistor M6 is turned on. Since the sixth transistor M6 is turned on to provide the signal of the clock signal terminal CLK at a high potential to the driving signal output terminal Output, the driving signal output terminal Output is at a high potential, i.e. outputting a high-potential scan signal. Since the second capacitor C2 is connected between the first node A and the driving signal output terminal Output, the potential of the first node A is further pulled up by the bootstrap function of the second capacitor C2 in order to keep the voltage difference across the second capacitor C2 stable, so that the sixth transistor M6 is fully turned on to provide the signal of the clock signal terminal CLK at a high potential to the driving signal output terminal Output with no voltage loss, such that the driving signal output terminal Output is at a high potential, i.e. outputting a high-potential scan signal. Since the driving signal output terminal Output is at a high potential, the fifth transistor M5 is turned on. Since the fifth transistor M5 is turned on to provide the signal of the reference signal terminal VSS at a low potential to the second node B, the second node B is at a low potential. Since the second node B is at a low potential, both the seventh transistor M7 and the eighth transistor M8 are turned off.

In a third phase T3, Input=0, Reset=0, CLK=0, CS=0.

Since Input=0, both the first transistor M1 and the third transistor M3 are turned off. Since CS=0, the ninth transistor M9 is turned off. Since Reset=0, both the second transistor M2 and the fourth transistor M4 are turned off, and the first node A is in a floating state. Since the first node A is in the floating state, the first node A is maintained at a high potential, so that the sixth transistor M6 is turned on. Since the sixth transistor M6 is turned on to provide the signal of the clock signal terminal CLK at a low potential to the driving signal output terminal Output, the driving signal output terminal Output is at a low potential, i.e. outputting a low-potential scan signal. Since the second capacitor C2 is connected between the first node A and the driving signal output terminal Output, the potential of the first node A returns to the high potential from the state of being further pulled-up by means of the bootstrap function of the second capacitor C2 in order to keep the voltage difference across the second capacitor C2 stable.

In a fourth phase T4, Input=0, Reset=1, CLK=0, CS=1.

Since Input=0, both the first transistor M1 and the third transistor M3 are turned off. Since Reset=1, both the second transistor M2 and the fourth transistor M4 are turned on. Since the fourth transistor M4 is turned on to provide the signal of the reset signal terminal Reset at a high potential to the second node B, the second node B is at a high potential, thereby charging the first capacitor C1. Since CS=1, the ninth transistor M9 is turned on. Since the ninth transistor M9 is turned on to provide the signal of the node stabilization control signal terminal CS at a high potential to the second node B, it is further ensured that the second node B is at a high potential. Since the second node B is at a high potential, both the seventh transistor M7 and the eighth transistor M8 are turned on. Since the seventh transistor M7 is turned on to provide the signal of the reference signal terminal VSS at a low potential to the driving signal output terminal Output, the driving signal output terminal Output is at a low potential, i.e. outputting a low-potential scan signal. Since the second transistor M2 is turned on to provide the signal of the reference signal terminal VSS at a low potential to the first node A, the first node A is at a low potential so that the second capacitor C2 is discharged. Since the eighth transistor M8 is turned on to provide the signal of the reference signal terminal VSS at a low potential to the first node A, it is further ensured that the first node A is at a low potential. Since the first node A is at a low potential, the sixth transistor M6 is turned off.

In a fifth phase T5, in the first half phase, Input=0, Reset=0, CLK=0, and CS=0.

Since Input=0, both the first transistor M1 and the third transistor M3 are turned off. Since CS=0, the ninth transistor M9 is turned off. Since Reset=0, both the second transistor M2 and the fourth transistor M4 are turned off, and the second node B is in a floating state. Since the second node B is in a floating state, the second node B is maintained at a high potential, so that both the seventh transistor M7 and the eighth transistor M8 are turned on. Since the seventh transistor M7 is turned on to provide the signal of the reference signal terminal VSS at a low potential to the driving signal output terminal Output, the driving signal output terminal Output is at a low potential, i.e. outputting a low-potential scan signal. Since the eighth transistor M8 is turned on to provide the signal of the reference signal terminal VSS at a low potential to the first node A, it is further ensured that the first node A is at a low potential. Since the first node A is at a low potential, the sixth transistor M6 is turned off.

In the fifth phase T5, in the second half phase, Input=0, Reset=0, CLK=1, and CS=0.

Since Input=0, both the first transistor M1 and the third transistor M3 are turned off. Since CS=0, the ninth transistor M9 is turned off. Since Reset=0, both the second transistor M2 and the fourth transistor M4 are turned off, and the second node B is in a floating state. Since the second node B is in a floating state, CLK=1 and the first capacitor C1 is connected between the second node B and the clock signal terminal CLK, the potential of the second node B is further pulled up by the bootstrap function of the first capacitor C1, so that the seventh transistor M7 and the eighth transistor M8 are fully turned on. Since the seventh transistor M7 is fully turned on to provide the signal of the reference signal terminal VSS at a low potential to the driving signal output terminal Output without voltage loss, the driving signal output terminal Output is at a low potential, i.e. outputting a low-potential scan signal. Since the eighth transistor M8 is fully turned on to provide the signal of the reference signal terminal VSS at a low potential to the first node A without voltage loss, it is further ensured that the first node A is at a low potential. Since the first node A is at a low potential, the sixth transistor M6 is turned off.

In the above shift register provided by embodiments of the present disclosure, after the fifth phase, the operating process of the fifth phase is repeatedly performed until the next frame starts.

In the above shift register provided by embodiments of the present disclosure, in the fifth phase and after the fifth stage, due to the bootstrap function of the first capacitor, the second node can be kept in a high potential state so as to ensure that the seventh transistor is always turned on to provide the signal of the reference signal terminal at a low potential to the driving signal output terminal, thereby keeping the driving signal output terminal always in a low potential state. As a result, the stability of the shift register is improved. When the shift register is applied to a display device, display stability of the display device can be improved.

Figure 4B:
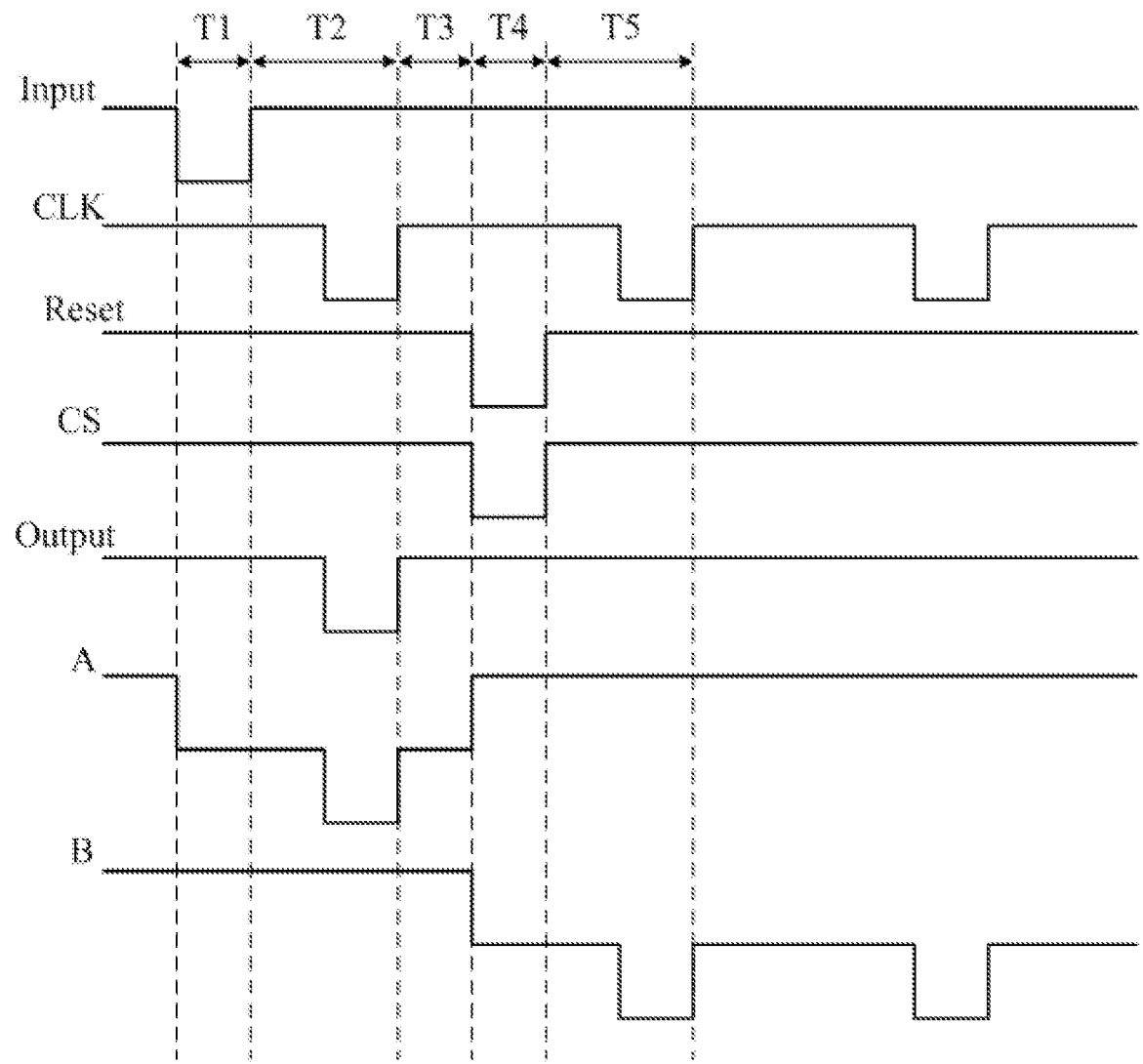
FIG. 4b is an input and output timing diagram of the shift register shown in FIG. 3b.

An operating process of the shift register will be described by taking the structure of the shift register shown in FIG. 3b as an example. In the shift register shown in FIG. 3b, all the transistors are P-type transistors, and each of the P-type transistors is turned on under the effect of a low potential at a control terminal thereof and turned off under the effect of a high potential at the control terminal thereof. A corresponding input and output timing diagram is shown in FIG. 4b.

In a first phase T1, Input=0, Reset=1, CLK=1, and CS=1.

Since Input=0, both the first transistor M1 and the third transistor M3 are turned on. Since the first transistor M1 is turned on to provide the signal of the input signal terminal Input at a low potential to the first node A, the first node A is at a low potential. Since the first node A is at a low potential, the sixth transistor M6 is turned on. Since the sixth transistor M6 is turned on to provide the signal of the clock signal terminal CLK at a high potential to the driving signal output terminal Output, the second capacitor C2 is charged, and the driving signal output terminal Output is at a high potential, i.e. outputting a high-potential scan signal. Since the third transistor M3 is turned on to provide the signal of the reference signal terminal VSS at a high potential to the second node B, the second node B is at a high potential. Since the second node B is at a high potential, both the seventh transistor M7 and the eighth transistor M8 are turned off. Since the driving signal output terminal Output is at a high potential, the fifth transistor M5 is turned off. Since CS=1, the ninth transistor M9 is turned off. Since Reset=1, both the second transistor M2 and the fourth transistor M4 are turned off.

In a second phase T2, in the first half phase, Input=1, Reset=1, CLK=1, and CS=1.

Since Input=1, both the first transistor M1 and the third transistor M3 are turned off. Since CS=1, the ninth transistor M9 is turned off. Since Reset=1, both the second transistor M2 and the fourth transistor M4 are turned off, so that the first node A is in a floating state. When the first node A is in the floating state, the first node A is maintained at a low potential, so that the sixth transistor M6 is turned on. Since the sixth transistor M6 is turned on to provide the signal of the clock signal terminal CLK at a high potential to the driving signal output terminal Output, the driving signal output terminal Output is at a high potential, i.e. outputting a high-potential scan signal.

In the second phase T2, in the second half phase, Input=1, Reset=1, CLK=0, and CS=1.

Since Input=1, both the first transistor M1 and the third transistor M3 are turned off. Since CS=1, the ninth transistor M9 is turned off. Since Reset=1, both the second transistor M2 and the fourth transistor M4 are turned off, and the first node A is in a floating state. Since the first node A is in the floating state, the first node A is maintained at a low potential, so that the sixth transistor M6 is turned on. Since the sixth transistor M6 is turned on to provide the signal of the clock signal terminal CLK at a low potential to the driving signal output terminal Output, the driving signal output terminal Output is at a low potential, i.e. outputting a low-potential scan signal. Since the second capacitor C2 is connected between the first node A and the driving signal output terminal Output, the potential of the first node A is further pulled down by the bootstrap effect of the second capacitor C2 in order to keep the voltage difference across the second capacitor C2 stable, so that the sixth transistor M6 is fully turned on to provide the signal of the clock signal terminal CLK at a low potential to the driving signal output terminal Output with no voltage loss, so that the driving signal output terminal Output is at a low potential, i.e. outputting a low-potential scan signal. Since the driving signal output terminal Output is at a low potential, the fifth transistor M5 is turned on. Since the fifth transistor M5 is turned on to provide the signal of the reference signal terminal VSS at a high potential to the second node B, the second node B is at a high potential. Since the second node B is at a high potential, both the seventh transistor M7 and the eighth transistor M8 are turned off.

In a third phase T3, Input=1, Reset=1, CLK=1, and CS=1.

Since Input=1, both the first transistor M1 and the third transistor M3 are turned off. Since CS=1, the ninth transistor M9 is turned off. Since Reset=1, both the second transistor M2 and the fourth transistor M4 are turned off, and the first node A is in a floating state. Since the first node A is in the floating state, the first node A is maintained at a low potential, so that the sixth transistor M6 is turned on. Since the sixth transistor M6 is turned on to provide the signal of the clock signal terminal CLK at a high potential to the driving signal output terminal Output, the driving signal output terminal Output is at a high potential, i.e. outputting a high-potential scan signal. Since the second capacitor C2 is connected between the first node A and the driving signal output terminal Output, the potential of the first node A returns to the low potential from the state of being further pulled down by means of the bootstrap function of the second capacitor C2 in order to keep the voltage difference across the second capacitor C2 stable.

In a fourth phase T4, Input=1, Reset=0, CLK=1, CS=0.

Since Input=1, both the first transistor M1 and the third transistor M3 are turned off. Since Reset=0, both the second transistor M2 and the fourth transistor M4 are turned on. Since the fourth transistor M4 is turned on to provide the signal of the reset signal terminal Reset at a low potential to the second node B, the second node B is at a low potential, thereby charging the first capacitor C1. Since CS=0, the ninth transistor M9 is turned on. Since the ninth transistor M9 is turned on to provide the signal of the node stabilization control signal terminal CS at a low potential to the second node B, it is further ensured that the second node B is at a low potential. Since the second node B is at a low potential, both the seventh transistor M7 and the eighth transistor M8 are turned on. Since the seventh transistor M7 is turned on to provide the signal of the reference signal terminal VSS at a high potential to the driving signal output terminal Output, the driving signal output terminal Output is at a high potential, i.e. outputting a high-potential scan signal. Since the second transistor M2 is turned on to provide the signal of the reference signal terminal VSS at a high potential to the first node A, the first node A is at a high potential, so that the second capacitor C2 is discharged. Since the eighth transistor M8 is turned on to provide the signal of the reference signal terminal VSS at a high potential to the first node A, it is further ensured that the first node A is at a high potential. Since the first node A is at a high potential, the sixth transistor M6 is turned off.

In a fifth phase T5, in the first half phase, Input=1, Reset=1, CLK=1, and CS=1.

Since Input=1, both the first transistor M1 and the third transistor M3 are turned off. Since CS=1, the ninth transistor M9 is turned off. Since Reset=1, both the second transistor M2 and the fourth transistor M4 are turned off, and the second node B is in a floating state. Since the second node B is in the floating state, the second node B is maintained at a low potential, so that both the seventh transistor M7 and the eighth transistor M8 are turned on. Since the seventh transistor M7 is turned on to provide the signal of the reference signal terminal VSS at a high potential to the driving signal output terminal Output, the driving signal output terminal Output is at a high potential, i.e. outputting a high-potential scan signal. Since the eighth transistor M8 is turned on to provide the signal of the reference signal terminal VSS at a high potential to the first node A, it is further ensured that the first node A is at a high potential. Since the first node A is at a high potential, the sixth transistor M6 is turned off.

In the fifth phase T5, in the second half phase, Input=1, Reset=1, CLK=0, and CS=1.

Since Input=1, both the first transistor M1 and the third transistor M3 are turned off. Since CS=1, the ninth transistor M9 is turned off. Since Reset=1, both the second transistor M2 and the fourth transistor M4 are turned off, and the second node B is in a floating state. Since the second node B is in the floating state, CLK=0 and the first capacitor C1 is connected between the second node B and the clock signal terminal CLK, the potential of the second node B is further pulled down by the bootstrap function of the first capacitor C1, so that the seventh transistor M7 and the eighth transistor M8 are fully turned on. Since the seventh transistor M7 is fully turned on to provide the signal of the reference signal terminal VSS at a high potential to the driving signal output terminal Output without voltage loss, the driving signal output terminal Output is at a high potential, i.e. outputting a high-potential scan signal. Since the eighth transistor M8 is fully turned on to provide the signal of the reference signal terminal VSS at a high potential to the first node A without voltage loss, it is further ensured that the first node A is at a high potential. Since the first node A is at a high potential, the sixth transistor M6 is turned off.

In the above shift register provided by embodiments of the present disclosure, after the fifth phase, the operating process of the fifth phase is repeatedly performed until the next frame starts.

In the above shift register provided by embodiments of the present disclosure, in the fifth phase and after the fifth phase, due to the bootstrap function of the first capacitor, the second node can be kept in a low potential state so as to ensure that the seventh transistor is always turned on to provide the signal of the reference signal terminal at a high potential to the driving signal output terminal, thereby keeping the driving signal output terminal always in a high potential state. As a result, the stability of the shift register is improved. When the shift register is applied to a display device, display stability of the display device can be improved.

Embodiments of the present disclosure further provide a driving method of any one of the above shift registers provided by the embodiments of the present disclosure. The driving method comprises a first phase, a second phase, a third phase, a fourth phase, and a fifth phase.

Specifically, as shown in FIG. 5, the method comprises the following steps. At step S501, in the first phase, the input sub-circuit provides the signal of the input signal terminal to the first node under the control of the signal of the input signal terminal, the first output sub-circuit provides the signal of the clock signal terminal to the driving signal output terminal under the control of the signal of the first node, and the node control sub-circuit provides the signal of the reference signal terminal to the second node under the control of the signal of the input signal terminal.

At step S502, in the second phase, in response to the first node being in a floating state, the first output sub-circuit maintains a stable voltage difference between the first node and the driving signal output terminal, and provides the signal of the clock signal terminal to the driving signal output terminal under the control of the signal of the first node. The node control sub-circuit provides the signal of the reference signal terminal to the second node under the control of the signal of the driving signal output terminal.

At step S503, in the third phase, in response to the first node being in a floating state, the first output sub-circuit maintains a stable voltage difference between the first node and the driving signal output terminal, and provides the signal of the clock signal terminal to the driving signal output terminal under the control of the signal of the first node. The potential maintenance sub-circuit maintains a stable voltage difference between the clock signal terminal and the second node in response to the second node being in a floating state.

At step S504, in the fourth phase, the reset sub-circuit provides the signal of the reference signal terminal to the first node under the control of the signal of the reset signal terminal, the node control sub-circuit provides the signal of the reset signal terminal to the second node under the control of the signal of the reset signal terminal, and the second output sub-circuit provides the signal of the reference signal terminal to the driving signal output terminal under the control of the signal of the second node.

At step S505, in the fifth phase, the potential maintenance sub-circuit maintains a stable voltage difference between the clock signal terminal and the second node in response to the second node being in a floating state, and the second output sub-circuit provides the signal of the reference signal terminal to the driving signal output terminal under the control of the signal of the second node.

With the above driving method provided by embodiments of the present disclosure, the potential maintenance sub-circuit can maintain the potential of the second node so as to ensure normal output of the second output sub-circuit, thereby improving the output stability of the shift register to make the output of the driving signal output terminal more stable.

Further, in the above driving method provided by embodiments of the present disclosure, when each shift register further comprises a first node stabilization sub-circuit, the driving method may further comprise: in the fourth phase, providing, by the first node stabilization sub-circuit, the signal of the reference signal terminal to the first node under the control of the signal of the second node, and in the fifth phase, providing, by the first node stabilization sub-circuit, the signal of the reference signal terminal to the first node under the control of the signal of the second node.

In the driving method provided by embodiments of the present disclosure, when each shift register further comprises a second node stabilization sub-circuit, the driving method may further comprise: in the fourth phase, providing, by the second node stabilization sub-circuit, the signal of the node stabilization control signal terminal to the second node under the control of the signal of the node stabilization control signal terminal.

In the above driving method provided by embodiments of the present disclosure, when each shift register further comprise both the first node stabilization sub-circuit and the second node stabilization sub-circuit, the driving method may further comprise: in the fourth phase, providing, by the first node stabilization sub-circuit, the signal of the reference signal terminal to the first node under the control of the signal of the second node, providing, by the second node stabilization sub-circuit, the signal of the node stabilization control signal terminal to the second node under the control of the signal of the node stabilization control signal terminal, and in the fifth phase, providing, by the first node stabilization sub-circuit, the signal of the reference signal terminal to the first node under the control of the signal of the second node.

Figure 6:
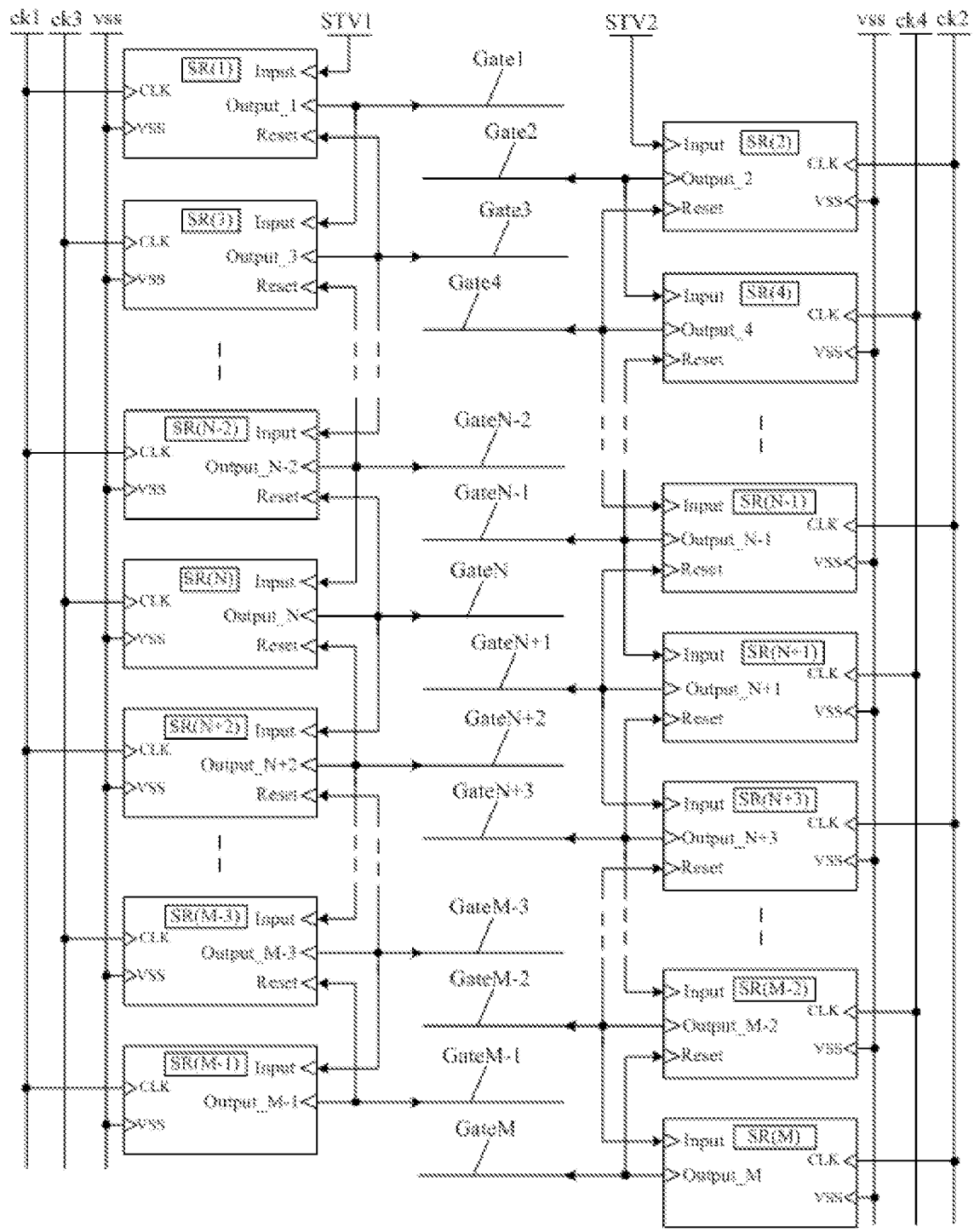
FIG. 6 is a schematic structural diagram of a gate driving circuit provided by embodiments of the present disclosure.

Embodiments of the present disclosure further provide a gate driving circuit, as shown in FIG. 6 (FIG. 6 illustrates an example in which the node stabilization control signal terminal and the reset signal terminal in the shift register of each stage are the same signal terminal), comprising cascaded M shift registers provided by embodiments of the present disclosure: SR(1), SR(2) . . . SR(N−2), SR(N−1), SR(N), SR(N+1), SR(N+2), SR(N+3) . . . SR(M−1), SR(M), where M is an integer greater than or equal to 3. Specifically, an input signal terminal Input of a first stage shift register SR(1) is connected to a first frame trigger signal terminal STV1; an input signal terminal Input of a second stage shift register SR(2) is connected to a second frame trigger signal terminal STV2; an input signal terminal Input of an N-th stage shift register SR(N) is connected to a driving signal output terminal Output of an (N−2)-th stage shift register SR(N−2); and a reset signal terminal Reset of the (N−2)-th stage shift register SR(N−2) is connected to a driving signal output terminal Output of the N-th stage shift register SR(N). N is an integer greater than or equal to 3 and less than or equal to M.

Specifically, the specific structure of each shift register in the above gate driving circuit is the same in function and structure as the above shift register of the present disclosure. The repeated description is omitted.

In some exemplary embodiments, in order to reduce the number of signal lines, the node stabilization control signal terminal and the input signal terminal in the shift register of each stage may be the same signal terminal.

In the above gate driving circuit provided by embodiments of the present disclosure, as shown in FIG. 6, a reference signal terminal VSS of a shift register of each stage is connected to the same direct current reference terminal vss. A clock signal terminal CLK of a (4k−3)-th stage shift register is connected to a first clock terminal ck1, a clock signal terminal CLK of a (4k−2)-th stage shift register is connected to a second clock terminal ck2, a clock signal terminal CLK of a (4k−1)-th stage shift register is connected to a third clock terminal ck3, and a clock signal terminal CLK of a 4k-th stage shift register is connected to a fourth clock terminal ck4, where k is an integer greater than or equal to 1.

Embodiments of the present disclosure further provide a display device comprising the above gate driving circuit.

The display device provided by embodiments of the present disclosure, as shown in FIG. 6, further comprises a plurality of gate lines: Gate1, Gate2, Gate3, Gate4 . . . GateN−2, GateN−1, GateN, GateN+1, GateN+2, GateN+3 . . . GateM−3, GateM−2, GateM−1, and GateM, and each gate line GateN is correspondingly connected to a driving signal output terminal Output_N of a shift register SR(N) of one stage in the gate driving circuit. The shift registers SR(1), SR(2) . . . SR(N−2), SR(N−1), SR(N), SR(N+1), SR(N+2), SR(N+3) . . . SR(M−1), and SR(M) of respective stages in the gate driving circuit provide scan signals to corresponding gate lines Gate1, Gate2, Gate3, Gate4 . . . GateN−2, GateN−1, GateN, GateN+1, GateN+2, GateN+3 . . . GateM−3, GateM−2, GateM−1, and GateM, respectively. For specific implementation thereof, reference may be made to the description of the above gate driving circuit, and the similarities are not described repeatedly.

In the above display device provided by embodiments of the present disclosure, as shown in FIG. 6, the gate driving circuit may be disposed on two sides of a display panel in the display device. Of course, the gate driving circuit may also be disposed on the same side of the display panel in the display device, which is not limited herein.

In the above display device provided by embodiments of the present disclosure, the display device may be any product or component having a display function such as a mobile phone, a tablet computer, a television, a display, a notebook computer, a digital photo frame, a navigator, and the like. Other essential components of the display device are understandable by those ordinarily skilled in the art, which are not described herein, and should not be taken as limiting the present disclosure.

Embodiments of the present disclosure provide a shift register, a driving method thereof, a gate driving circuit, and a display device. The shift register provided comprises: an input sub-circuit, a reset sub-circuit, a node control sub-circuit, a potential maintenance sub-circuit, a first output sub-circuit, and a second output sub-circuit, wherein the input sub-circuit is configured to provide the signal of the input signal terminal to the first node under the control of the signal of the input signal terminal; the reset sub-circuit is configured to provide the signal of the reference signal terminal to the first node under the control of the signal of the reset signal terminal; the potential maintenance sub-circuit is configured to maintain a stable voltage difference between the clock signal terminal and the second node in response to the second node being in a floating state; the node control sub-circuit is configured to provide the signal of the reference signal terminal to the second node under the control of the signal of the input signal terminal, provide the signal of the reset signal terminal to the second node under the control of the signal of the reset signal terminal, and provide the signal of the reference signal terminal to the second node under the control of a signal of the driving signal output terminal; the first output sub-circuit is configured to provide the signal of the clock signal terminal to the driving signal output terminal under the control of the signal of the first node, and maintain a stable voltage difference between the first node and the driving signal output terminal in response to the first node being in a floating state; and the second output sub-circuit is configured to provide the signal of the reference signal terminal to the driving signal output terminal under the control of the signal of the second node. Therefore, it is possible to enable the potential maintenance sub-circuit to maintain the potential of the second node by means of cooperation of the above six sub-circuits so as to ensure normal output of the second output sub-circuit, thereby improving the output stability of the shift register to make the output of the driving signal output terminal more stable.

It will be apparent to those skilled in the art that various modifications and variations can be made in the present disclosure without departing from the spirit and scope thereof. Thus, if these modifications and variations of the present disclosure fall within the scope of the claims of the present disclosure and their equivalent technologies, the present disclosure is also intended to include these modifications and variations.

The invention claimed is:

1. A shift register comprising:
   an input sub-circuit,
   a reset sub-circuit,
   a potential maintenance sub-circuit,
   a node control sub-circuit,
   a first output sub-circuit, and
   a second output sub-circuit,
   wherein the input sub-circuit is connected to an input signal terminal and a first node, respectively, and configured to provide a signal of the input signal terminal to the first node under the control of the signal of the input signal terminal;
   wherein the reset sub-circuit is connected to a reset signal terminal, a reference signal terminal, and the first node, respectively, and configured to provide a signal of the reference signal terminal to the first node under the control of a signal of the reset signal terminal;
   wherein the potential maintenance sub-circuit is connected to a clock signal terminal and a second node, respectively, and configured to maintain a stable voltage difference between the clock signal terminal and the second node in response to the second node being in a floating state;
   wherein the node control sub-circuit is connected to the input signal terminal, the reset signal terminal, the reference signal terminal, the second node, and a driving signal output terminal of the shift register, respectively, and configured to:
      provide the signal of the reference signal terminal to the second node under the control of the signal of the input signal terminal,
      provide the signal of the reset signal terminal to the second node under the control of the signal of the reset signal terminal, and
      provide the signal of the reference signal terminal to the second node under the control of a signal of the driving signal output terminal;
   wherein the first output sub-circuit is connected to the clock signal terminal, the first node, and the driving signal output terminal, respectively, and configured to provide the signal of the clock signal terminal to the driving signal output terminal under the control of the signal of the first node, and maintain a stable voltage difference between the first node and the driving signal output terminal in response to the first node being in a floating state; and wherein the second output sub-circuit is connected to the reference signal terminal, the second node, and the driving signal output terminal, respectively, and configured to provide the signal of the reference signal terminal to the driving signal output terminal under the control of a signal of the second node.

2. The shift register according to claim 1, wherein the potential maintenance sub-circuit comprises a first capacitor, and wherein one end of the first capacitor is connected to the clock signal terminal, and the other end of the first capacitor is connected to the second node.

3. The shift register according to claim 1, wherein the input sub-circuit comprises a first transistor, and wherein a control terminal and a first terminal of the first transistor are both connected to the input signal terminal, and a second terminal of the first transistor is connected to the first node.

4. The shift register according to claim 1, wherein the reset sub-circuit comprises a second transistor, and wherein a control terminal of the second transistor is connected to the reset signal terminal, a first terminal of the second transistor is connected to the reference signal terminal, and a second terminal of the second transistor is connected to the first node.

5. The shift register according to claim 1, wherein the node control sub-circuit comprises:
a third transistor,
a fourth transistor, and
a fifth transistor;
wherein, a control terminal of the third transistor is connected to the input signal terminal, a first terminal of the third transistor is connected to the reference signal terminal, and a second terminal of the third transistor is connected to the second node;
wherein a control terminal and a first terminal of the fourth transistor are both connected to the reset signal terminal, and a second terminal of the fourth transistor is connected to the second node; and
wherein a control terminal of the fifth transistor is connected to the driving signal output terminal, a first terminal of the fifth transistor is connected to the reference signal terminal, and a second terminal of the fifth transistor is connected to the second node.

6. The shift register according to claim 1, wherein the first output sub-circuit comprises a sixth transistor and a second capacitor,
wherein a control terminal of the sixth transistor is connected to the first node, a first terminal of the sixth transistor is connected to the clock signal terminal, and a second terminal of the sixth transistor is connected to the driving signal output terminal; and
wherein one end of the second capacitor is connected to the first node, and the other end of the second capacitor is connected to the driving signal output terminal.

7. The shift register according to claim 1, wherein the second output sub-circuit comprises a seventh transistor, and wherein a control terminal of the seventh transistor is connected to the second node, a first terminal of the seventh transistor is connected to the reference signal terminal, and a second terminal of the seventh transistor is connected to the driving signal output terminal.

8. The shift register according to claim 1, further comprising a first node stabilization sub-circuit, wherein the first node stabilization sub-circuit is connected to the reference signal terminal, the first node, and the second node, respectively, and configured to provide the signal of the reference signal terminal to the first node under the control of the signal of the second node.

9. The shift register according to claim 8, wherein the first node stabilization sub-circuit comprises an eighth transistor, and wherein a control terminal of the eighth transistor is connected to the second node, a first terminal of the eighth transistor is connected to the reference signal terminal, and a second terminal of the eighth transistor is connected to the first node.

10. The shift register according to claim 1, further comprising a second node stabilization sub-circuit, wherein the second node stabilization sub-circuit is connected to a node stabilization control signal terminal and the second node, respectively, and configured to provide a signal of the node stabilization control signal terminal to the second node under the control of the signal of the node stabilization control signal terminal.

11. The shift register according to claim 10, wherein the second node stabilization sub-circuit comprises a ninth transistor, and wherein a control terminal and a first terminal of the ninth transistor are both connected to the node stabilization control signal terminal, and a second terminal of the ninth transistor is connected to the second node.

12. A gate driving circuit comprising cascaded M shift registers according to claim 1, M being an integer greater than or equal to 3,
wherein an input signal terminal of a first stage shift register is connected to a first frame trigger signal terminal;
wherein an input signal terminal of a second stage shift register is connected to a second frame trigger signal terminal;
wherein an input signal terminal of an N-th stage shift register is connected to a driving signal output terminal of an (N−2)-th stage shift register; and
wherein a reset signal terminal of the (N−2)-th stage shift register is connected to a driving signal output terminal of the N-th stage shift register, N being an integer greater than or equal to 3 and less than or equal to M.

13. A display device comprising the gate driving circuit according to claim 12.

14. The gate driving circuit according to claim 12, wherein the potential maintenance sub-circuit comprises a first capacitor, and wherein one end of the first capacitor is connected to the clock signal terminal and the other end of the first capacitor is connected to the second node.

15. The gate driving circuit according to claim 12, wherein the input sub-circuit comprises a first transistor, and wherein a control terminal and a first terminal of the first transistor are both connected to the input signal terminal, and a second terminal of the first transistor is connected to the first node.

16. The gate driving circuit according to claim 12, wherein the reset sub-circuit comprises a second transistor, and wherein a control terminal of the second transistor is connected to the reset signal terminal, a first terminal of the second transistor is connected to the reference signal terminal, and a second terminal of the second transistor is connected to the first node.

17. The gate driving circuit according to claim 12, wherein the node control sub-circuit comprises:
a third transistor,
a fourth transistor, and
a fifth transistor;

wherein a control terminal of the third transistor is connected to the input signal terminal, a first terminal of the third transistor is connected to the reference signal terminal, and a second terminal of the third transistor is connected to the second node;

wherein a control terminal and a first terminal of the fourth transistor are both connected to the reset signal terminal, and a second terminal of the fourth transistor is connected to the second node; and wherein a control terminal of the fifth transistor is connected to the driving signal output terminal, a first terminal of the fifth transistor is connected to the reference signal terminal, and a second terminal of the fifth transistor is connected to the second node.

18. A driving method of a shift register according to claim 1, comprising:
a first phase,
a second phase,
a third phase,
a fourth phase, and
a fifth phase,
wherein, in the first phase:
the input sub-circuit provides the signal of the input signal terminal to the first node under the control of the signal of the input signal terminal;
the first output sub-circuit provides the signal of the clock signal terminal to the driving signal output terminal under the control of the signal of the first node; and
the node control sub-circuit provides the signal of the reference signal terminal to the second node under the control of the signal of the input signal terminal;
wherein in the second phase:
the first output sub-circuit maintains a stable voltage difference between the first node and the driving signal output terminal in response to the first node being in a floating state, and provides the signal of the clock signal terminal to the driving signal output terminal under the control of the signal of the first node; and
the node control sub-circuit provides the signal of the reference signal terminal to the second node under the control of the signal of the driving signal output terminal;
wherein in the third phase:
the first output sub-circuit maintains a stable voltage difference between the first node and the driving signal output terminal in response to the first node being in a floating state, and provides the signal of the clock signal terminal to the driving signal output terminal under the control of the signal of the first node; and the potential maintenance sub-circuit maintains a stable voltage difference between the clock signal terminal and the second node in response to the second node being in a floating state;

wherein in the fourth phase:
the reset sub-circuit provides the signal of the reference signal terminal to the first node under the control of the signal of the reset signal terminal;
the node control sub-circuit provides the signal of the reset signal terminal to the second node under the control of the signal of the reset signal terminal; and
the second output sub-circuit provides the signal of the reference signal terminal to the driving signal output terminal under the control of the signal of the second node; and in the fifth phase:
the potential maintenance sub-circuit maintains a stable voltage difference between the clock signal terminal and the second node in response to the second node being in a floating state; and
the second output sub-circuit provides the signal of the reference signal terminal to the driving signal output terminal under the control of the signal of the second node.

19. The driving method according to claim 18, wherein each shift register further comprises a first node stabilization sub-circuit, and wherein the first node stabilization sub-circuit is connected to the reference signal terminal, the first node, and the second node, respectively, and configured to provide the signal of the reference signal terminal to the first node under the control of the signal of the second node, and the driving method further comprises:
in the fourth phase, providing, by the first node stabilization sub-circuit, the signal of the reference signal terminal to the first node under the control of the signal of the second node; and
in the fifth phase, providing, by the first node stabilization sub-circuit, the signal of the reference signal terminal to the first node under the control of the signal of the second node.

20. The driving method according to claim 18, wherein each shift register further comprises a second node stabilization sub-circuit, and wherein the second node stabilization sub-circuit is connected to a node stabilization control signal terminal and the second node, respectively, and configured to provide a signal of the node stabilization control signal terminal to the second node under the control of the signal of the node stabilization control signal terminal, and the driving method further comprises:
in the fourth phase, providing, by the second node stabilization sub-circuit, the signal of the node stabilization control signal terminal to the second node under the control of the signal of the node stabilization control signal terminal.

* * * * *